United States Patent [19]

Hampel

[11] 4,133,040
[45] Jan. 2, 1979

[54] MULTI-FUNCTION LOGIC GATE WITH ONE GATE DELAY

[75] Inventor: Daniel Hampel, Westfield, N.J.
[73] Assignee: RCA Corporation, New York, N.Y.
[21] Appl. No.: 811,870
[22] Filed: Jun. 30, 1977
[51] Int. Cl.² ............... G06F 7/50; H03K 19/08; H03K 19/32
[52] U.S. Cl. .................. 364/773; 307/207; 307/216
[58] Field of Search ............ 364/773, 784; 307/207, 307/211, 216

[56] References Cited

U.S. PATENT DOCUMENTS

| | | | |
|---|---|---|---|
| 3,609,329 | 9/1971 | Martin | 364/773 |
| 3,769,499 | 4/1972 | Heightley | 364/773 |
| 3,906,212 | 9/1975 | Poguntke | 364/784 |
| 3,916,215 | 10/1975 | Gaskill et al. | 307/211 X |
| 3,978,329 | 8/1976 | Baugh et al. | 364/785 |

Primary Examiner—David H. Malzahn
Attorney, Agent, or Firm—H. Christoffersen; H. I. Schanzer

[57] ABSTRACT

A class of logic circuits in which different types of current switching logic gates are connected to different nodes of a current summing network for concurrently producing different logic functions of the same input variables. In one embodiment, N single-input current switches forming a threshold logic gate are operated with their inputs parallelling respective ones of an N-input current switch forming an emitter-coupled logic (ECL) OR-gate. An output current of the ECL gate is combined with the out-of-phase output currents of the threshold gate in a first current summing network, comprised of at least two resistors, for producing different logic functions of the signals applied to the N inputs. The in-phase output currents of the threshold gate are supplied to a second summing network for producing still different logic functions of the input signals. The different logic functions produced at the different nodes of the two summing networks may be further combined (e.g. logically OR'ed) to produce predetermined logic functions, such as the FULL ADDER or EXCLUSIVE-OR within approximately one gate delay.

17 Claims, 3 Drawing Figures

MULTI-FUNCTION LOGIC GATE WITH ONE GATE DELAY

This invention relates to current switching logic gates and, in particular, to different types of current switching logic gates which share a current summing network and which in response to the same input variables, or their complements, produce different logic functions at various nodes of the summing network within, approximately, one gate delay.

Logic gates are known in which different current switching circuits share a summing network. For example, FIG. 2 of U.S. Pat. No. 3,678,292 issued to the present Applicant shows a first logic circuit (10, 12, 14) one of whose outputs (terminal 32) is applied to the input (base of transistor 40a) of a second, feedback, circuit (40) whose output (collector of transistor 40b) in turn modifies another output (28, 24) of the first circuit. But, in the circuit of U.S. Pat. No. 3,678,292, there is a first delay between the time the input variables are applied and the time the first output is generated and applied to the feedback circuit and a second delay until the feedback circuit modifies the second output to produce the desired logic function.

Other logic gates are known in which different logic functions of given input variables are generated by using a summing network comprised of series connected resistors as shown, for example, in U.S. Pat. No. 3,825,770, also issued to the present Applicant. But, in this type of circuit the functions generated at the various nodes of the summing network are directly related since the same current flows through each resistor of the summing network. A complex (non-threshold) logic gate such as an ADDER or an EXCLUSIVE-OR can not be produced with only one circuit of this type.

A complex logic gate in which an output is formed within approximately one gate delay of the application of the inputs is shown in U.S. Pat. No. 3,519,810 entitled LOGIC ELEMENT (FULL ADDER) USING TRANSISTOR TREE LIKE CONFIGURATION issued to U. Priel et al. But, this reference uses series gating which requires: (1) a multiplicity of bias levels; (2) that some of the signals be shifted up and down; and (3) that some of the transistors be operated at different reference voltages. Circuits embodying the invention can produce complex and/or non-threshold logic functions within approximately one gate delay without series gating and without the accompanying need for a multiplicity of reference voltages. In this application it is understood that among the class of non-threshold functions are those in which both a variable (e.g. A) and its complement (e.g. $\bar{A}$) appear in the reduced Boolean expression for the function.

Circuits embodying the invention include two summing networks. At least one of the two summing networks includes a first impedance connected between first and second nodes and a second impedance connected between the second node and a reference terminal. The other of the two summing networks includes means connecting a third impedance between a third node and the reference terminal. An N-input logic gate is connected at its output to the first node and passes a current through the first and second impedances only when its N-inputs are in one binary condition. Also included are N current switches each responsive to a different one of the N inputs and each capable of supplying a current to a first output or to a second output. The first outputs of the N-current switches are connected to the second node and the second outputs of the current switches are connected to the third node. The signals produced at selected ones of the nodes are combined via voltage followers to produce a predetermined logic function of the N-inputs within approximately one gate delay.

In the drawings, like reference characters denote like components, and

Figure 1:
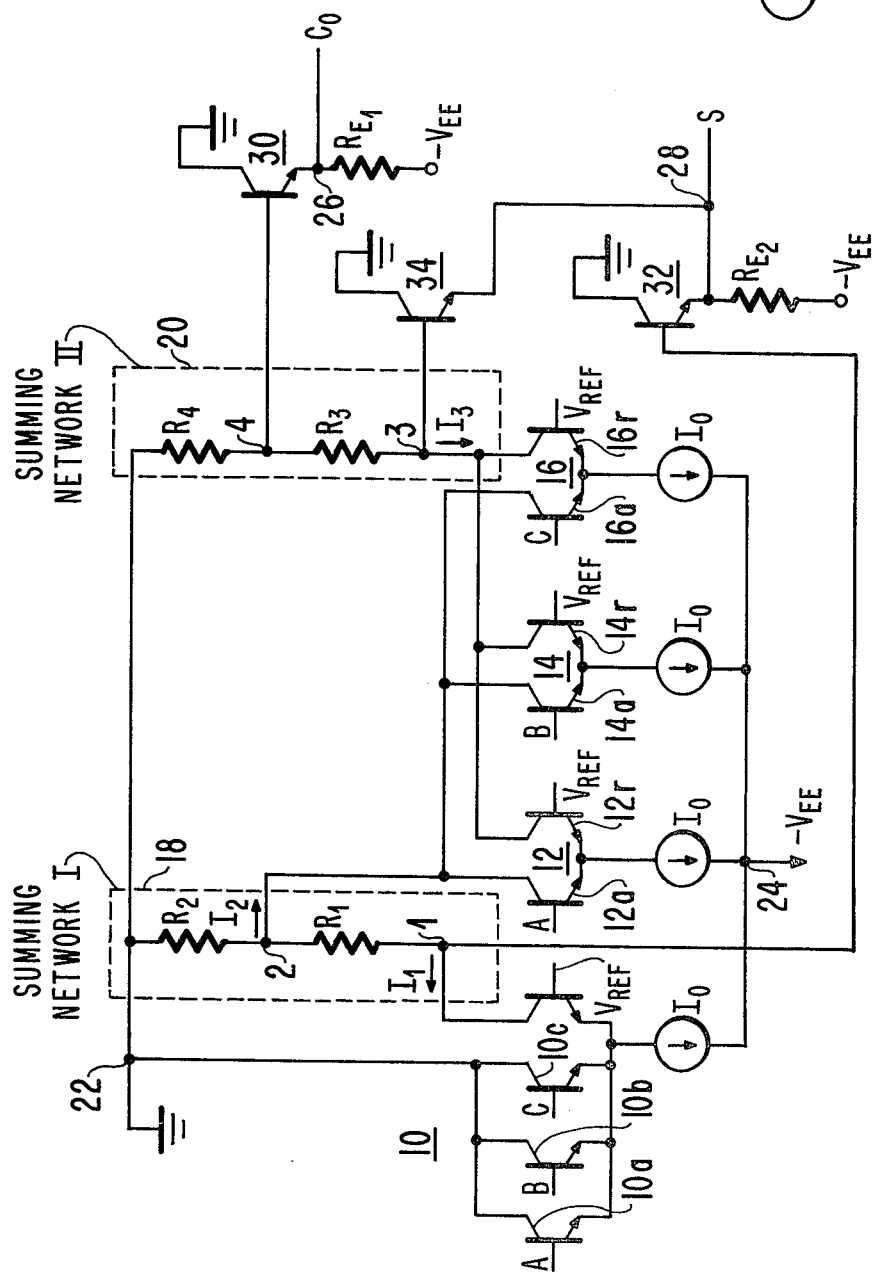
FIG. 1 is a schematic diagram of a three (3) input FULL-ADDER embodying the invention.

The FULL ADDER circuit of FIG. 1 includes four (4) current switches, 10, 12, 14 and 16, which control the currents flowing through the 4 resistors (R1, R2, R3 and R4) comprising the two summing networks (18, 20) in response to three input signals denoted as A, B and C.

Current switch 10 is a three-input emitter-coupled logic (ECL) OR gate comprised of NPN bipolar transistors 10a, 10b, 10c and a reference transistor 10r. The collectors of transistors 10a, 10b and 10c are connected to terminal 22 which is grounded. The emitters of transistors 10a, 10b, 10c and 10r are connected in common and via a relatively constant current source to terminal 24. Each one of the three input signals, A, B, and C, is applied to the base of a transistor having a similar alphabetical subscript, and a reference potential, $V_{REF}$, is applied to the base of transistor 10r. The output current of current switch 10 is derived from the collector of transistor 10r which is connected to one end of resistor R1 at node 1.

Current switches 12, 14 and 16 form a threshold gate. Each one of current switches 12, 14 and 16 includes a pair of NPN bipolar transistors. Each pair includes an a (signal) transistor and an r (reference) transistor connected at their emitters through a relatively constant current source to terminal 24. The input signals A, B and C are applied to the bases of transistors 12a, 14a and 16a, respectively, and $V_{REF}$ is applied to the r transistor of each pair. The collectors of transistors 12a, 14a and 16a, at which flow the out-of-phase currents (with respect to the a inputs), are connected in common to node 2 to which is connected the other end of resistor R1 and one end of resistor R2. The collectors of transistors 12r, 14r, and 16r, at which flow the in-phase currents, are connected to node 3 to which is connected one end of resistor R3.

The other end of resistor R3 is connected to one end of resistor R4 at node 4. The other ends of resistors R2 and R4 are connected to terminal 22. Resistors R1 and R2 comprise summing network I also denoted as 18 and resistors R3 and R4 comprise summing network II also denoted as 20.

The potentials $V_1$ and $V_2$ at nodes 1 and 2, respectively, are determined by the combined effect of the out-of-phase currents from switches 12, 14 and 16 and the output current of switch 10. The potentials $V_3$ and $V_4$ at nodes 3 and 4, respectively, are determined by the in-phase currents of switches 12, 14 and 16.

Emitter follower transistor 30 is connected at its collector to terminal 22, at its base to node 4 and at its emitter to output terminal 26 at which is produced a carry signal denoted as $C_0$. $C_0$ represents the MAJORITY function of the 3 input signals A, B and C and its potential is equal to the potential ($V_4$) at node 4 less the $V_{BE}$ drop of transistor 30. Emitter follower transistors 32 and 34 are connected at their collectors to terminal 22 and at their bases to nodes 1 and 3, respectively. Their emitters are connected in common (virtually OR'ed) to output terminal 28 at which is produced a sum signal, denoted as S. The output S is the OR connection of the potentials $V_1$ and $V_3$ less the $V_{BE}$ drop of transistors 32 or 34 and represents the EXCLUSIVE-OR function of the 3-input variables A, B and C. The emitter of transistor 30 is returned via emitter resistor $R_{E1}$ to terminal 24 and the emitters of transistors 32 and 34 are returned via emitter resistor $R_{E2}$ to terminal 24.

A potential $V_{EE}$ which, for example, may be equal to $-5$ volts is applied to terminal 24. In the circuit of FIG. 1 where NPN transistors are used $V_{REF}$ is positive with respect to $V_{EE}$, but negative with respect to ground, $V_{REF}$ may be, for example, $-2.5$ volts.

Figure 2:
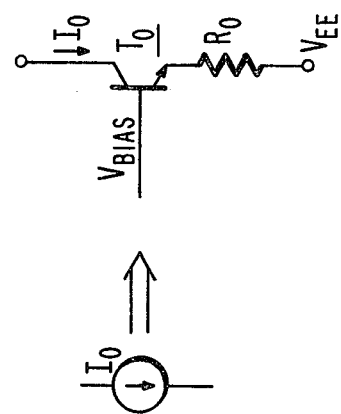
FIG. 2 is a schematic diagram of a relatively constant current source circuit which may be used in the circuit of FIG. 1.

Each one of the relatively constant current sources in the emitter legs of the current switches may, as shown in FIG. 2, comprise a transistor, $T_0$, having its collector-to-emitter path connected in series with a resistor, $R_0$, between the emitters of a current switch and terminal 24. A fixed bias, $V_{BIAS}$, is applied to the base of each $T_0$ transistor causing a relatively constant current $I_0$ to flow in its collector-to-emitter path. The amplitude of a unit of current, $I_0$, is determined by the total potential difference across $R_0$ divided by the value of $R_0$. $I_0 = [(V_{BIAS} - V_{BE}) - V_{EE}]/R_0$.

For ease of describing the operation of the circuit, the following definitions, assumptions and explanations are given here.

a. The same inputs A, B and C applied to the bases of transistors 10a, 10b, and 10c, respectively, are applied to the bases of transistors 12a, 14a and 16a, respectively.

b. The relatively constant currents supplied to the joined emitter electrodes of the transistors of current switches 10, 12, 14 and 16 respectively are each assumed to be of the same value $I_0$, which is termed "unit of current".

c. Assume that resistors R1, R2, R3 and R4 have identical ohmic values such that $R1 = R2 = R3 = R4 = R$.

d. The voltages at the output terminals are compared to a reference potential which could be any arbitrarily selected value. However, to make a plurality of gates compatible with each other, all outputs are compared to a well defined threshold level defined in this specification as $V_{REF}$. Therefore, by referencing all outputs to $V_{REF}$, the outputs of a gate are compatible with the input requirements of successive gates (not shown) to which they may be directly connected. An input signal A, B or C or an output signal $C_0$ or S whose potential is more positive than $V_{REF}$ is defined as logic "1" or high while an input or output signal whose potential is less positive than $V_{REF}$ is defined as logic "0" or low.

e. For a potential of $V_{REF}$ at the output terminals ($C_0$, S) the corresponding potential ($V_1$, $V_2$, $V_3$, or $V_4$) at the summing nodes (1, 2, 3, 4) is $V_{REF} + V_{BE}$ which is defined here as $V_{REF1}$. For ease of description in this specification, a voltage level at any of the summing nodes 1 through 4 which causes a potential of less than $V_{REF}$ to be produced at its associated output terminal is called a "low" or logic "0" signal and a voltage level at any of the summing nodes which causes a potential of more than $V_{REF}$ to be produced at its associated terminal is called a "high" or logic "1" signal.

f. For the FULL ADDER circuit of FIG. 1, the voltage threshold at any node of the summing network occurs when the voltage drop between the reference terminal 22 and the particular node is equal to $3/2\ I_0 \cdot R$. Therefore, when the voltage drop at a node is less than $3/2\ I_0 \cdot R$ the voltage at that node represents a "1" or "high" and when the voltage drop exceeds $3/2\ I_0 \cdot R$ the voltage represents a "zero" or "low". (R is selected such that $3/2\ I_0 \cdot R$ plus $V_{BE}$ is equal to $V_{REF}$).

g. A unit of current flows through resistors R1 and R2 if all the input variables (A, B, C) are less positive than $V_{REF}$. If any one of the input signals is more positive than $V_{REF}$ there is no current through R1. The current through R1 is denoted at $I_1$.

h. A unit of current ($I_0$) flows through resistor R2 for each one of the input signals which is more positive than $V_{REF}$. The total current flowing through resistor R2 is denoted as $I_2$.

i. A unit of current ($I_0$) flows through resistor R3 and R4 for each one of the input signals which is more negative than $V_{REF}$. The total current flowing through resistors R3 and R4 is denoted as $I_3$.

j. The voltages at the various nodes may be expressed as follows: $V_2 = [I_1 + I_2]R$; $V_1 = [V_2 + I_1R]$; $V_4 = I_3R$; and $V_3 = I_3 \cdot 2R$.

k. Due to voltage translation by the emitter followers, the voltage at $C_0$ is $V_{BE}$ volts less than that at $V_4$ but is always of the same binary significance. The voltage at S is $V_{BE}$ volts less than whichever one of $V_1$ or $V_3$ is the more positive and is of the same binary significance as the more positive of $V_1$ or $V_3$.

l. It is also useful to define the product of $I_0 \cdot R$ as a "single potential unit" expressed as $\Delta V$. A voltage drop at a node of a summing network of less than 1 and $\frac{1}{4}\ \Delta V$ produces a logic "1" at the node and at the corresponding output terminal, while a voltage drop of more than 1 and $\frac{1}{4}\ \Delta V$ at a node produces a logic "0" at the node and at the corresponding terminal.

The signals generated at the nodes of the summing networks as well as the signals produced at the output terminals in response to the various combinations of the input variables are as follows:

I. If all the inputs A, B and C are low, then 1 unit of current flows through R2 and R1 and 3 units of current flow through R3 and R4. The potential at the nodes of the summing networks are then as follows:
$V_2 = (-) I_0 \cdot R$ = high; $V_1 = (-) I_0 \cdot 2R$ = low $V_4 = (-) 3I_0 \cdot R$ = low; $V_3 = (-) 3I_0 \cdot 2R$ = low The carry output ($C_0$) derived from node 4 is low, and the sum output (S) derived from nodes 1 and 3 which are OR'ed is also low.

II. If any one of the three inputs is high, then no current flows through R1, one unit of current flows through R2, and two units of current flow through R3 and R4. The potentials at the nodes of the summing networks are then as follows: $V_2 = (-) I_0 \cdot R$ = high; $V_1 = V_2 = (-) I_0 \cdot R$ = high; $V_4 = (-) 2I_0 \cdot R$ = low; $V_3 = (-) 2I_0 \cdot 2R$ = low; accordingly, $C_0$ is then low and S is high.

III. If two of the three inputs are high, then again no current flows through R1, and $I_1 = 0$. Two units of current flow through R2, and $I_2$ is equal to $2I_0$, while one unit of current flows through R3 and R4 and $I_3 = I_4 = I_0$. The potentials at nodes 1, 2, 3 and 4 are then: $V_2 = (-) 2I_0 \cdot R$ = low; $V_1 = V_2$ = low; $V_4 = (-) I_0 \cdot R$ = high; $V_3 = (-) I_0 \cdot 2R$ = low. Therefore, $C_0$ is high and S is low.

IV. If the three inputs are high, then: (a) no current flows through R1, and $I_1 = 0$; (b) 3 units of current flow through R2 and $I_2 = 3 I_0$; and (c) no current flows through R3 and R4, and $I_3 = I_4 = 0$. The potentials at the nodes 1, 2, 3 and 4 are then: $V_2 = (-) 3I_0 \cdot R = $ low; $V_1 = V_2 = $ low; $V_4 = V_3 = $ high. Therefore $C_0$ and S are both high.

The response of the circuit to the various conditions of the three input variables are summarized in the table below.

| No. of Inputs Hi Among (A,B,C) | Sum of Current Units, $I_0$ | | | Potential Units of $\Delta V = I_0R$ | | | | Outputs | |
|---|---|---|---|---|---|---|---|---|---|
| | $I_1$ | $I_2$ | $I_3$ | $V_2 = (I_1 + I_2)R$ | $V_1 = V_2 + I_1R$ | $V_4 = I_3R$ | $V_3 = I_3 \cdot 2R$ | $C_0$ $V_4$ | S ($V_3$ or $V_1$) |
| 0 | 1 | 0 | 3 | 1 | 2 | 3 | 6 | 0 | 0 |
| 1 | 0 | 1 | 2 | 1 | 1 | 2 | 4 | 0 | 1 |
| 2 | 0 | 2 | 1 | 2 | 2 | 1 | 2 | 1 | 0 |
| 3 | 0 | 3 | 0 | 3 | 3 | 0 | 0 | 1 | 1 |

The four minterms for which the sum and carry functions are at logical one level (using positive logic) may be obtained from the foregoing table and may be expressed as follows:

$$C_0 = ABC + AB\overline{C} + A\overline{B}C + \overline{A}BC$$

$$S = ABC + A\overline{BC} + \overline{A}B\overline{C} + \overline{AB}C$$

Clearly, $C_0$ represents the majority function of the three inputs, A, B and C, and S represents the EXCLUSIVE-OR function of the three inputs. Where, for example, A and B are two binary numbers to be added, and C is the carry input, the circuit provides the FULL ADDER function.

The signals at the nodes of the summing network are formed within one gate delay and these signals are then coupled via emitter followers to the output terminals. Since the delay through the emitter followers is very small, it is evident that the sum output S is produced within approximately one gate delay of the application of the input signals. In the circuit, the same $V_{REF}$ is applied to the bases of the "reference" transistors, hence only one $V_{REF}$ is needed.

The circuit of FIG. 1 may be used as a 3-bit odd parity checker since the sum output is high whenever an odd number of input variables (A, B or C) are high. To perform this function the carry out, $C_0$, is not required. Hence, R4 is also not required and a single resistor R3 would be used and would be set equal to 2R. Since all the current switches operate in about the same time (after the appearance of the 3 inputs), the outputs at $V_1$ and $V_3$ appear at about the same time.

Figure 3:
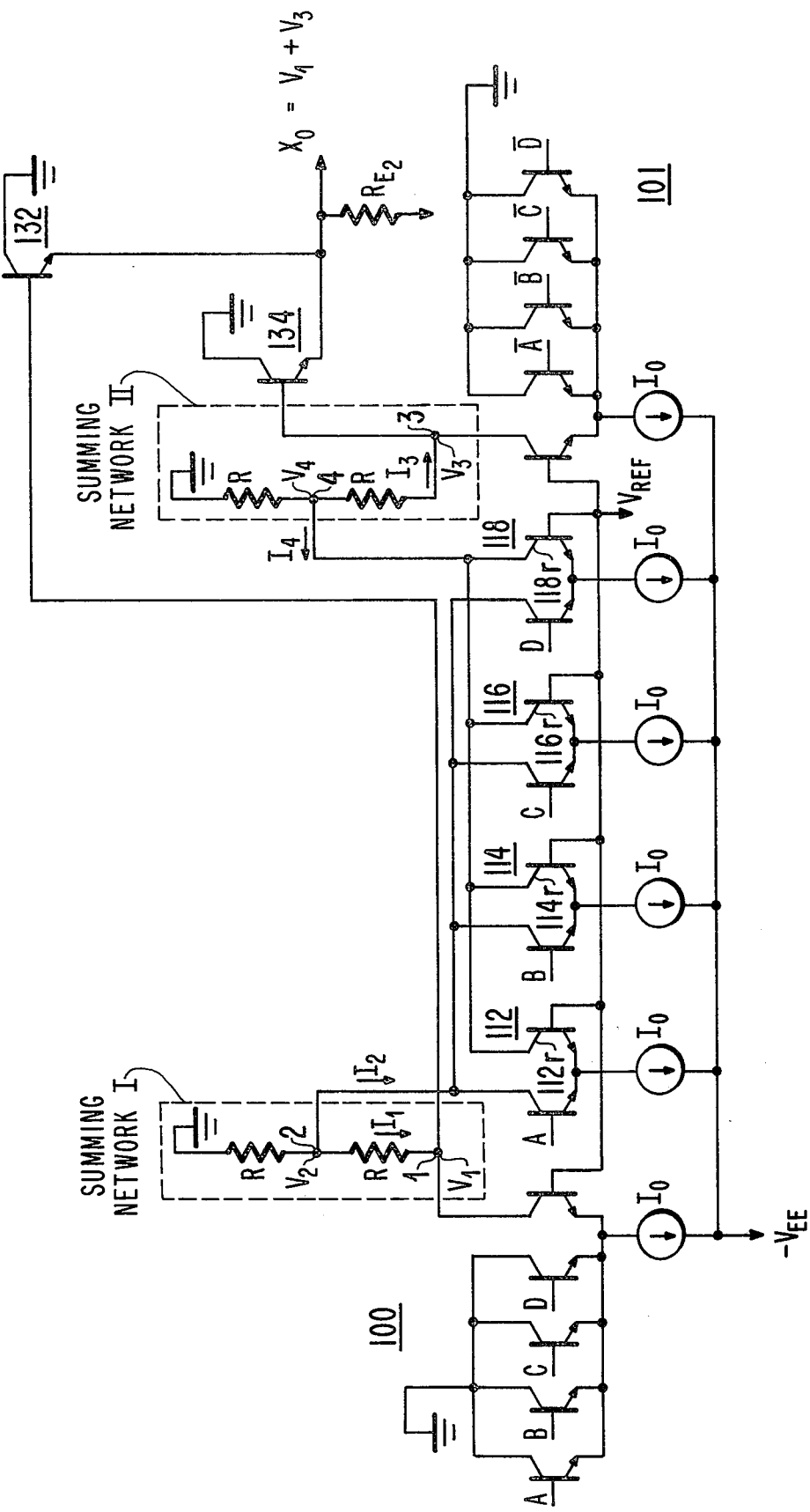
FIG. 3 is a schematic diagram of a four (4) input EXCLUSIVE-OR circuit embodying the invention.

The circuit of FIG. 1 may be modified as shown in FIG. 3 to produce other clases of both threshold (e.g. MAJORITY) and non-threshold (e.g. EXCLUSIVE-OR) functions within approximately one gate delay. In FIG. 3, two four-input OR gates (100, 101) and a threshold gate comprising four current switches (112, 114, 116, 118) control the currents through summing networks I and II. The circuit of FIG. 3 is similar to that of FIG. 1 except for the addition of OR gate 101 whose output is connected to node 3 and that the collectors of the reference transistors of the threshold gate current switches are connected to node 4, thereby supplying their in-phase currents to that node. In addition, each gate is designed to accommodate 4 inputs and includes a transistor or switch per signal input. Furthermore, the input signals ($\overline{A}, \overline{B}, \overline{C}, \overline{D}$) applied to the inputs of OR gate 101 (bases of transistors 101a, b, c and d) are the complement of the signals applied to the other signal inputs of the circuit.

The outputs ($V_1$ and $V_3$) generated at nodes 1 and 3 are virtually OR'ed by means of emitter followers 132 and 134 to produce an output $X_0$ which represents the EXCLUSIVE-OR function of the 4 inputs.

The following table gives the unit of currents flowing through the summing resistors and the voltages developed at nodes 1 and 3 and the output $X_0$, where as before, $I_1$, $I_2$, $I_3$ and $I_4$ are the total currents flowing through resistors $R_1$, $R_2$, $R_3$ and $R_4$ respectively and where a potential unit $\Delta V$ is equal to $I_0 \cdot R$ where $I_0$ is the unit of current at the emitters of each current switch.

| No. of Inputs, Hi Among (A,B,C,D) | Sum of Current Units, Io | | | | Potential Units, $\Delta V = I_0R$ | | Output-$X_0$ |
|---|---|---|---|---|---|---|---|
| | $I_1$ | $I_2$ | $I_4$ | $I_3$ | $V_1 = 2RI_1 + RI_2$ | $V_3 = 2RI_3 + RI_4$ | $V_1$ or $V_3$ |
| 0 | 1 | 0 | 4 | 0 | 2 | 4 | 0 |
| 1 | 0 | 1 | 3 | 0 | 1 | 3 | 1 |
| 2 | 0 | 2 | 2 | 0 | 2 | 2 | 0 |
| 3 | 0 | 3 | 1 | 0 | 3 | 1 | 1 |
| 4 | 0 | 4 | 0 | 1 | 4 | 2 | 0 |

$X_0$ is high logic "1" if $V_1$ or $V_3$ is equal to or less than 1 potential unit.

$X_0$ may be expressed in terms of the input variables as:

$$X_0 = \overline{A}BCD + A\overline{B}CD + AB\overline{C}D + ABC\overline{D} + \overline{ABCD}$$
$$+ \overline{AB}C\overline{D} + \overline{A}BC\overline{D} + \overline{A}B\overline{C}D$$

The outputs $V_1$ and $V_3$ are formed within one gate delay and $X_0$, the EXCLUSIVE-OR function, is produced within approximately one gate delay. As for the circuit of FIG. 1 this is achieved with one reference voltage ($V_{REF}$) and from the same source of operating voltage.

The circuit of FIG. 3 can be expanded to accept N-inputs where N is an integer greater than one (1). Each one of the two OR gates would include N + 1 transistors, one for each of the N input variables and one for the reference voltage and the threshold gate would include N separate current switches, one for each input variable. The two outputs $V_1$ and $V_3$ would still be virtually OR'ed to produce a third combined output.

The values of the summing resistors determine the functions obtained at the sum nodes. The value R of any one of the summing resistors can be altered such that X units of current must flow through it to cause an output voltage equal to $V_{REF}$ where X may be any number between 1 and N. Thus, the circuits of the invention teach an approach for achieving a class of both threshold (e.g. MAJORITY) and non-threshold (e.g. EXCLUSIVE-OR) functions within approximately one gate delay based on current summing through resistor networks of the output currents produced by clusters of emitter coupled switches. In these circuits, output signals are obtained which are relatively large and virtually independent of gate fan-in.

What is claimed is:

1. The combination comprising:
   a first power terminal for the application thereto of an operating potential;
   first, second, and third circuit nodes;
   first, second, and third impedance means for producing a voltage drop proportional to the current therethrough;
   means connecting said first impedance means between said first and second nodes;
   means connecting said second impedance means between said second node and said first terminal;
   means connecting said third impedance means between said third node and said first terminal;
   an N-input logic gate having an output connected to said first node, said N-input gate passing a current through said first and second impedance means when all of its N-inputs are in one binary state and passing no current through said first and second impedance means when any one of its inputs is in the other binary state;
   N current switches, each current switch having a first input terminal adapted to receive an input signal and a second input terminal adapted to receive a reference signal and first and second output lines for conducting a load current on said first output line when said input signal is more positive than said reference signal and for conducting approximately the same load current on said second output line when said input signal is more negative than said reference signal;
   means coupling the first output line of each one of said current switches in common to said second node; and
   means coupling the second output line of each one of said current switches in common to said third node.

2. The combination as claimed in claim 1 wherein said means connecting said third impedance means between said first terminal and said third node includes a fourth node and a fourth impedance means, said fourth impedance means being connected between said first terminal and said fourth node, and said third impedance means being connected between said third and fourth nodes.

3. The combination as claimed in claim 2 wherein said first, second, third and fourth impedance means are resistors, and wherein all the resistors have the same ohmic value.

4. The combination as claimed in claim 2 further including means for ORRING the signals produced at said first and third nodes.

5. The combination as claimed in claim 4 wherein said N-input logic gate includes N transistors each having a base, a collector and an emitter, wherein the collectors of said N transistors are connected in common to a point of fixed reference potential, wherein the emitters of said N transistors are connected in common to the emitter of an additional reference transistor, wherein a different binary input signal is applied to a different one of the bases of said N transistors and wherein a reference potential is applied to the base of said additional transistor; and wherein a relatively constant current means is connected between the emitters of said transistors and a second power terminal adapted to receive an operating potential.

6. The combination as claimed in claim 5 wherein each one of said N current switches includes a pair of transistors connected in common at their emitters with a relatively constant current source connected between the emitters and said second power terminal; means for applying a different one of said binary input signals to each input of said N current switches; wherein the collector of one transistor of each pair is connected to said second node, wherein a reference potential is applied to the bases of the other transistor of each pair, and wherein the collectors of said other transistors of each pair are connected to said third node.

7. The combination as claimed in claim 6 wherein N is equal to 3; and
   further including: (a) first, second and third voltage followers, each having an input and an output; (b) means connecting the input of said first voltage follower to said fourth node for producing at its output the carry function of the three input variables; (c) means connecting the input of said second voltage follower to said first input node; (d) means connecting the input of said third voltage follower to said third node: and (e) means connecting the outputs of said second and third voltage followers in common for producing the sum function of the three input variables.

8. The combination as claimed in claim 1 further including: (a) a fourth impedance means connected between said third node and a fourth node; and (b) a second N-input logic gate having an output connected to said fourth node, said N input gate passing a current through said third and fourth impedance means when all of its N-inputs are in one binary state and passing no current through said third and fourth impedance means when any one of its inputs is in the other binary state.

9. The combination as claimed in claim 8 wherein said first, second, third, and fourth impedance means are resistors, and wherein all the resistors have the same ohmic value.

10. The combination as claimed in claim 9 further including first and second voltage followers, each having an input and an output, means connecting the inputs of said first and second voltage followers to said first and fourth nodes, respectively and means connecting their outputs to a common output terminal to "OR" the signals applied to their inputs.

11. The combination as claimed in claim 10 wherein the signals applied to the N inputs of the second logic gate are the complements of the signals applied to the N inputs of the logic gate whose output is connected to said first node.

12. The combination as claimed in claim 10 wherein said voltage followers are emitter followers.

13. A logic circuit comprising:
   means for supplying first through nth input signals, where n is an integer greater than one, each of said input signals assuming a first or a second logic level;
   a threshold logic gate having first through nth input connections connected to receive respective ones of said first through nth input signals and having first and second output connections at which in-phase and out-of-phase current responses to said input signals, respectively, appear;

a first emitter-coupled logic gate having first through nth input connections connected to receive respective ones of said first through nth input signals and having an output connection at which a given output current is produced in response to a given condition of said input signals;

orring means having first and second input connections and having an output connection at which an output signal of said logic circuit is to be available;

first summing combining means proportionally responsive to both of the out-of-phase current response of said threshold logic gate and the given output current of said first emitter-coupled logic gate to provide a signal applied to the first input connection of said orring means; and second summing means proportionally responsive to the in-phase current response of said threshold logic gate to provide a signal applied to the second input connection of said orring means.

14. A logic circuit as claimed in claim 13 wherein:
n equals three; and
said threshold logic gate provides an in-phase current response that is equal to a unity current times the number of the input signals applied to its first through third input connections that are at a first logic level state and an out-of-phase current response that is equal to a unity current times the number of the input signals applied to its first through third input connections that are at a second logic level.

15. A logic circuit as claimed in claim 14 having second means proportionally responsive to the in-phase current response of said threshold logic gate for providing a carry signal.

16. A logic circuit as claimed in claim 13 wherein n equals four;
wherein said threshold logic gate provides an in-phase current response that is equal to a unity current times the number of the input signals applied to its first through fourth input connections that are at a first logic level and an out-of-phase current response that is equal to a unity current times the number of the input signals applied to its first through fourth input connections that are at a second logic level;
further including a second emitter-coupled logic gate which has first through fourth inputs connected to receive the complements of respective ones of said first through fourth input signals and has an output connection at which is produced a current response to any of said input signals being in a given condition; and
wherein said second summing means proportionally responsive to the in-phase current response of said threshold logic gate to provide a signal applied to the second input connection of said orring means is comprised within an additive combining means proportionally responsive both to the in-phase current response of said threshold logic gate and to the current response of said second emitter-coupled logic gate.

17. A logic circuit as claimed in claim 13 wherein n equals four;
wherein said threshold logic gate provides an in-phase current response that is equal to a unity current times the number of the input signals applied to its first through fourth input connections that are at a first logic level and an out-of-phase current response that is equal to a unity current times the number of the input signals applied to its first through fourth input connections that are at a second logic level;
a second emitter-coupled logic gate is included, which has first through fourth inputs connected to receive the complements of respective ones of said first through fourth input signals and has an output connection at which is produced a current response to any of said input signals being in a given condition;
wherein said first summing network includes first and second impedance means wherein said out-of-phase current response is applied to one end of said first and second impedance means; wherein said output connection of said first emitter-coupled logic gate is connected to the other end of said first impedance means; and wherein the other end of said second impedance means is connected to a point of reference potential; and
wherein said second summing network includes third and fourth impedance means; wherein said in-phase current response is applied to one end of said third and fourth impedance means; wherein said output connection of said second emitter-coupled logic gate is connected to the other end of said third impedance means; and wherein the other end of said fourth impedance means is connected to a point of reference potential.

* * * * *